(12) United States Patent
Anderson et al.

(10) Patent No.: US 8,591,749 B2
(45) Date of Patent: Nov. 26, 2013

(54) CHROMELESS PHASE-SHIFTING PHOTOMASK WITH UNDERCUT RIM-SHIFTING ELEMENT

(71) Applicant: International Business Machines Corporation, Armonk, NY (US)

(72) Inventors: Brent A. Anderson, Jericho, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/688,879

(22) Filed: Nov. 29, 2012

(65) Prior Publication Data

US 2013/0089815 A1   Apr. 11, 2013

Related U.S. Application Data

(62) Division of application No. 12/702,787, filed on Feb. 9, 2010, now Pat. No. 8,389,183.

(51) Int. Cl.
G03F 1/28 (2012.01)
G03F 1/29 (2012.01)

(52) U.S. Cl.
USPC ............................................. 216/12; 430/5

(58) Field of Classification Search
USPC ............................................. 216/12; 430/5
See application file for complete search history.

(56) References Cited

U.S. PATENT DOCUMENTS

| 5,268,244 A | 12/1993 | Yoo |
| 5,478,679 A | 12/1995 | Loong et al. |
| 5,487,962 A | 1/1996 | Rolfson |
| 5,495,959 A | 3/1996 | Rolfson |
| 5,565,286 A | 10/1996 | Lin |
| 5,582,939 A | 12/1996 | Pierrat |
| 5,620,817 A | 4/1997 | Hsu et al. |
| 6,458,495 B1 | 10/2002 | Tsai et al. |
| 2003/0203285 A1* | 10/2003 | Chung et al. ............ 430/5 |
| 2006/0199084 A1 | 9/2006 | Word |
| 2006/0204862 A1 | 9/2006 | Park et al. |
| 2006/0257752 A1 | 11/2006 | Kim et al. |

OTHER PUBLICATIONS

Grant, Roger and Claire, Grant & Hackh's Chemical Dictionary, Fifth Edition, 1987, McGraw-Hill, Inc., p. 487.*
Grant, Roger and Claire, Grant & Hackh's Chemical Dictionary, Fifth Edition, 1987, McGraw-Hill, Inc., p. 518.*
Ruggles, Office Action Communication for U.S. Appl. No. 12/702,787 dated Mar. 14, 2012, 14 pages.
Ruggles, Office Action Communication for U.S. Appl. No. 12/702,787 dated Aug. 3, 2012, 14 pages.
Ruggles, Notice of Allowance and Fee(s) Due for U.S. Appl. No. 12/702,787 dated Nov. 2, 2012, 7 pages.

* cited by examiner

*Primary Examiner* — Mark F Huff
*Assistant Examiner* — John S Ruggles
(74) *Attorney, Agent, or Firm* — Richard M. Kotulak; Hoffman Warnick LLC (57) ABSTRACT

A phase-shifting photomask with a self aligned undercut rim-shifting element and methods for its manufacture are provided. One embodiment of the invention provides a method of manufacturing a phase-shifting photomask having a self aligned rim-shifting element, the method comprising: applying a patterning film to a first portion of a transparent substrate; etching the substrate to a depth to remove a second portion of the substrate not beneath the patterning film; etching the first portion of the substrate to undercut an area beneath the patterning film; and removing the patterning film, wherein the etched substrate forms a self-aligned undercut rim-shifting element.

8 Claims, 7 Drawing Sheets

FIG. 13

CHROMELESS PHASE-SHIFTING PHOTOMASK WITH UNDERCUT RIM-SHIFTING ELEMENT

CROSS-REFERENCE TO RELATED APPLICATIONS

This application is a divisional application of U.S. patent application Ser. No. 12/702,787, filed 9 Feb. 2010, now U.S. Pat. No. 8,389,183 issued Mar. 5, 2013, which is hereby incorporated herein.

TECHNICAL FIELD

The present invention relates generally to semiconductor manufacturing and, more specifically, to chromeless phase-shifting photomasks having undercut rim-shifting elements and related methods for their manufacture.

BACKGROUND OF THE INVENTION

Photolithography techniques have progressed to the point that the critical dimension (CD) is often smaller than the actinic wavelength of the radiation (e.g., ultraviolet light) employed, requiring the effects of optical diffraction to not only be accounted for, but often utilized for imaging today's sub-micron features. In response, various phase-shifting techniques have been employed to mitigate the detrimental effects of diffraction by taking advantage of the destructive interference caused by phase shifting.

Photomasks incorporating rim-shifting elements are one type of phase-shifting device so employed. Some rim-shifting photomasks employ a pattern of opaque light blocking elements on a transparent substrate. A transparent phase shift material, such as quartz, covers the opaque light blocking elements and the transparent substrate, such that light passing through the thicker transparent phase shift material along the side walls of the opaque light blocking elements is phase shifted with respect to light passing through the thinner phase shift material between the opaque light blocking elements. The intersection of the phase-shifted light from the two regions forms a null on the wafer. This utilizes the effects of diffraction along the edges of the opaque light blockers and produces a sharpened image. The light transmission produced by such phase-shifting is binary, in that two transmissions are produced: a first passing through the thinner phase shift material and a second passing through the thicker phase shift material along the side walls of the opaque light blocking elements. Typically, the second transmission is phase-shifted 180° with respect to the first transmission.

SUMMARY OF THE INVENTION

Embodiments of the invention provide a phase-shifting photomask with a self aligned rim-shifting element and methods for its manufacture.

One embodiment of the invention provides a method of manufacturing a phase-shifting photomask having a self aligned rim-shifting element, the method comprising: applying a patterning film to a first portion of a transparent substrate; etching the substrate to a depth to remove a second portion of the substrate not beneath the patterning film; etching the first portion of the substrate to undercut an area beneath the patterning film; and removing the patterning film, wherein the etched substrate forms a self-aligned undercut rim-shifting element.

Another embodiment of the invention provides a photomask comprising: a transparent substrate including: a first portion; a second portion atop the first portion, the second portion including an undercut adjacent the first portion; and a third portion atop the first portion, the third portion including an undercut adjacent the first portion, wherein the first, second, and third portions of the transparent substrate are disposed to provide a plurality of transmission paths through the photomask.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
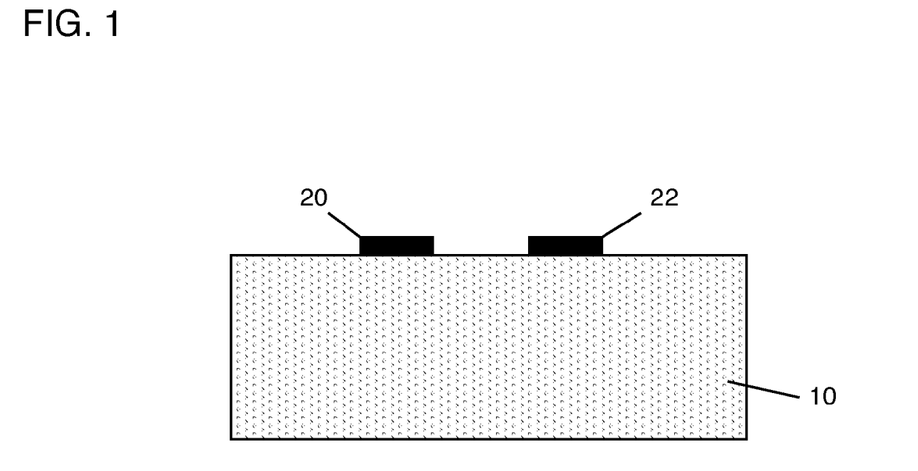
FIGS. 1-4 show cross-sectional side views of steps in the manufacture of a photomask according to one embodiment of the invention.

Referring now to the drawings, FIG. 1 shows a transparent photomask substrate 10, on top of which has been deposited a patterning film 20, 22. Suitable transparent substrates will be recognized by one skilled in the art, but may include, for example, quartz (fused silica), modified or doped quartz, and crystalline fluorides, such as calcium fluoride, magnesium fluoride, barium fluoride, and lithium fluoride. Patterning film 20, 22 may include, for example, chromium, a refractory metal (e.g., tungsten), a metal silicide (e.g., molybdenum silicide), a metal nitride (e.g., tungsten nitride), silicon, amorphous silicon, or amorphous carbon. Patterning film 20, 22 may be formed or deposited by any known or later-developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. After such deposition, the deposited material may be patterned using a mask and etched.

Figure 2:
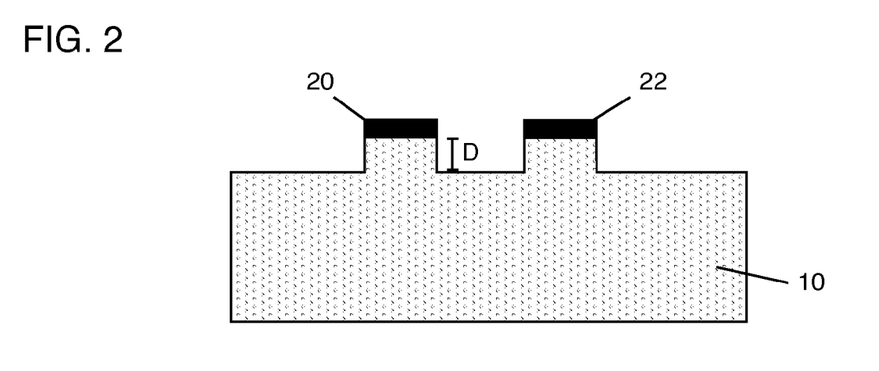

In FIG. 2, substrate 10 has been etched to a first depth D. Substrate 10 may be etched using any known or later-developed technique, such as wet chemical etching.

Figure 3:
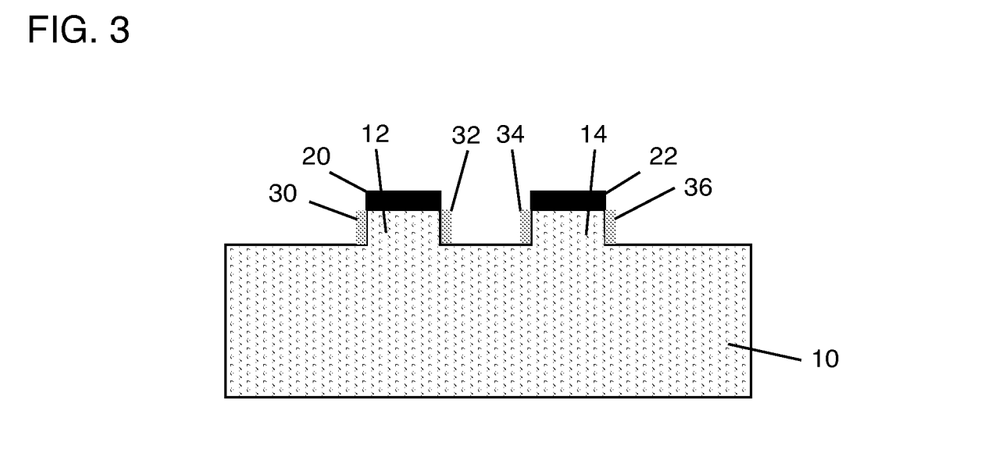

In FIG. 3, sidewall spacers 30, 32, 34, 36 have been applied to the pedestals 12, 14 of transparent substrate 10 beneath patterning film 20, 22. Sidewall spacers 30, 32, 34, 36 may include, for example, quartz, photoresist, or polyimide, and may be applied by any known or later-developed technique, including conformal deposition and anisotropic etching, or selective deposition. It is understood that while four sidewall spacers have been delineated, the spacers may be connected as they extend about the pedestals 12, 14.

Figure 4:
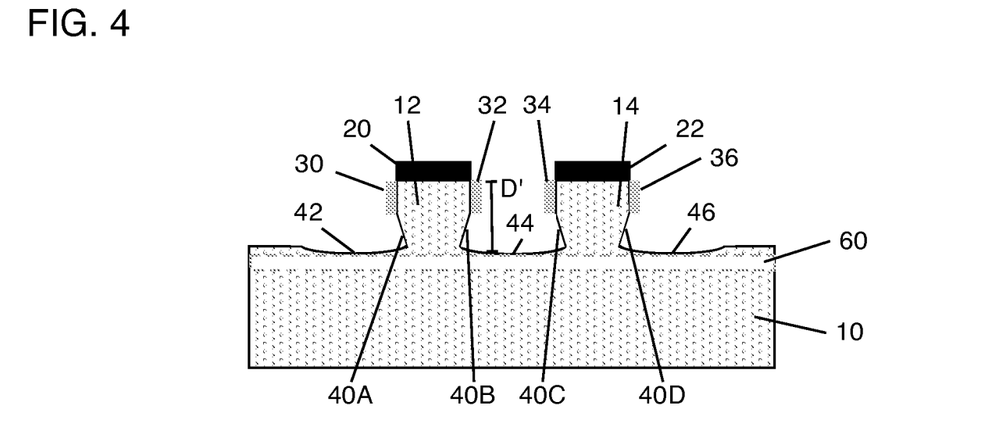

FIG. 4 shows substrate 10 following isotropic etching to form undercuts 40A, 40B, 40C, 40D of pedestals 12 and 14. Etching may be discontinued upon reaching a chosen depth D'. Alternatively, as will be described in greater detail below with respect to FIGS. 7 and 8, substrate 10 may include a transparent etch stop layer 60 (shown in phantom) at depth D' to which substrate 10 is etched. In cases where isotropic etching or another etching technique is used without transparent etch stop layer 60, it typically yields a concavity 42, 44, 46 along the top surface of substrate 10.

Figure 5:
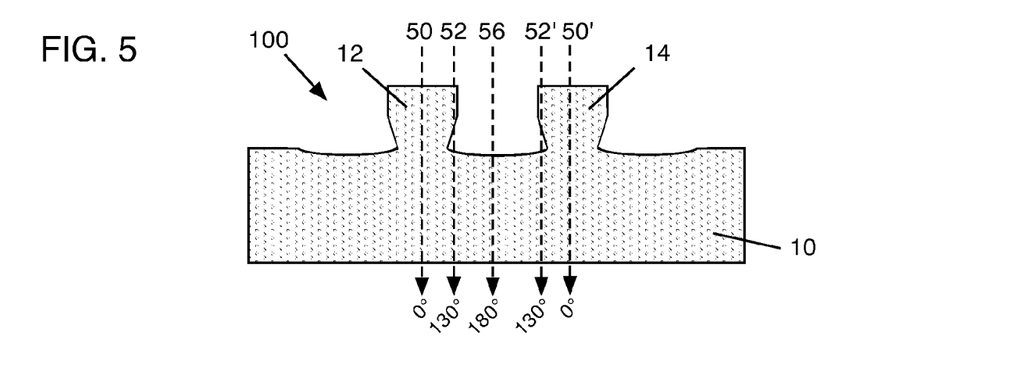
FIGS. 5 and 6 show transmission paths through photomasks according to illustrative embodiments of the invention.

FIG. 5 shows a completed photomask 100 according to an embodiment of the invention. Patterning film 20, 22 and sidewall spacers 30, 32, 34, 36 have been removed, yielding a photomask 100 having three transmission paths 50, 52, 56. First path 50 (and similarly 50') passes through pedestal 12 (and similarly 14) of substrate 10 and substrate 10, yielding a relative phase shift of 0°. Third path 56, passes through substrate 10 only, yielding a relative phase shift of 180° with respect to first path 50. Thus, first path 50 and third path 56 yield phase shifts as might be achieved using known phase-shifting photomasks. However, in the embodiment shown in FIG. 5, second path 52 (and similarly 52') passes through pedestal 12 (and similarly 14), the atmosphere within the undercut (40B in FIG. 4) of pedestal 12 (and similarly 14), and substrate 10, and yields a phase shift intermediate that of first path 50 and third path 56. In the embodiment shown in FIG. 5, the phase shift of second path 52 is 130° with respect to first path 50. Other phase shifts intermediate those of first path 50 and third path 56 may be achieved by varying, for example, the extent and/or angle to which pedestal 12 is undercut.

Figure 6:
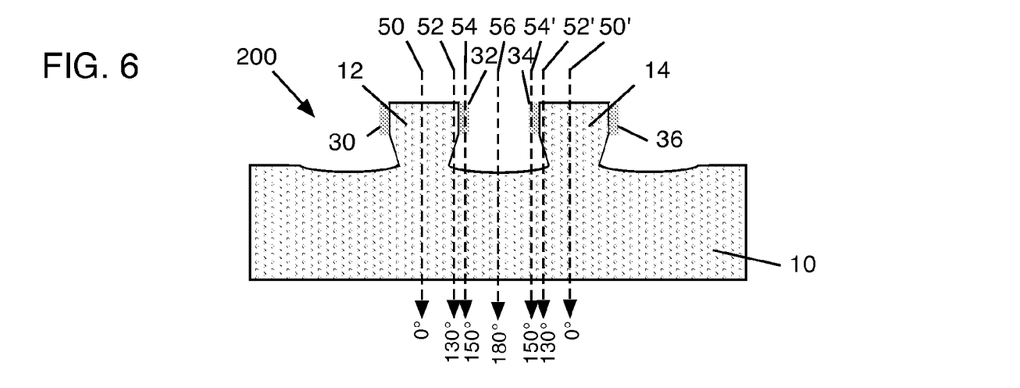

FIG. 6 shows a photomask 200 according to another embodiment of the invention, in which sidewall spacers 30, 32, 34, 36 remain on pedestals 12, 14 to yield a fourth transmission path 54 (and similarly 54'). Fourth path 54 passes through sidewall spacer 32, the atmosphere beneath sidewall spacer 32, and substrate 10, yielding a phase shift between that of second path 52 and third path 56. In the embodiment shown in FIG. 6, the phase shift of fourth path 54 is 150° with respect to first path 50.

Figure 7:
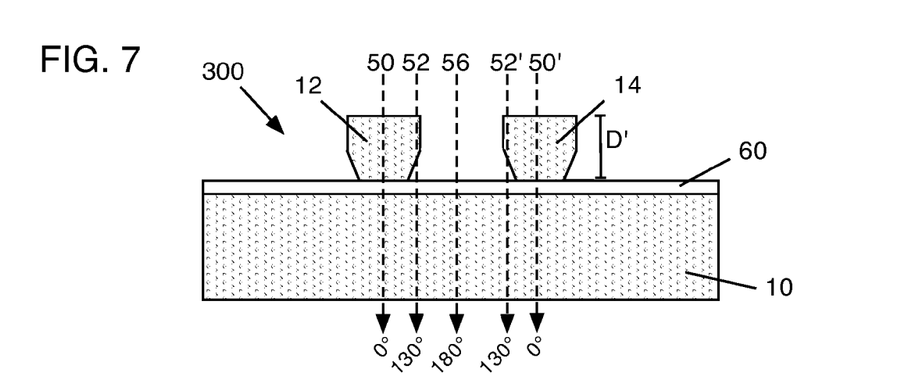
FIGS. 7 and 8 show photomasks according to other embodiments of the invention, as well as their transmission paths.
Figure 8:
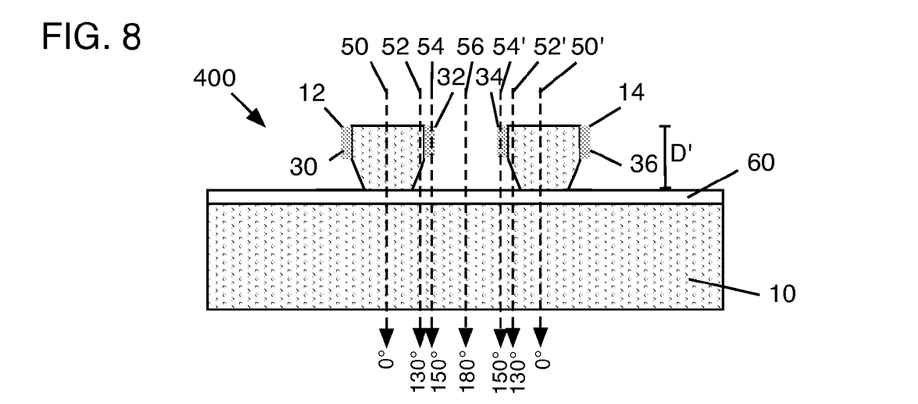

FIGS. 7 and 8 show other embodiments of the invention in which a transparent etch stop layer 60 is included in substrate 10 at depth D'. Transparent etch stop layer 60 may include, for example, doped quartz, sapphire, or silicon. As can be seen, photomask 300 of FIG. 7 yields transmission paths analogous to those of photomask 100 of FIG. 5, and photomask 400 of FIG. 8 yields transmission paths analogous to those of photomask 200 of FIG. 6. However, transparent etch stop layer 60 prevents the formation of concavities 42, 44, 46 (FIG. 4) in the top surface of substrate 10.

Figure 9:
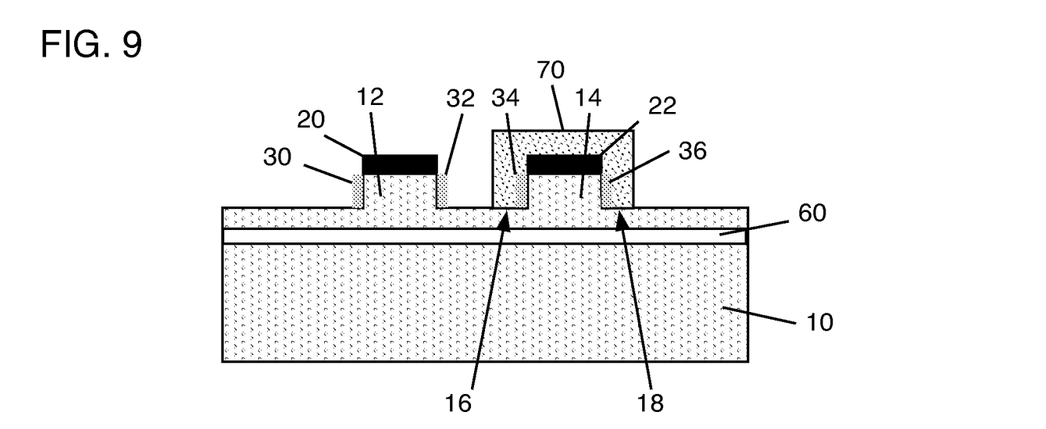
FIGS. 9-11 show steps in the manufacture of a photomask according to another embodiment of the invention.
Figure 10:
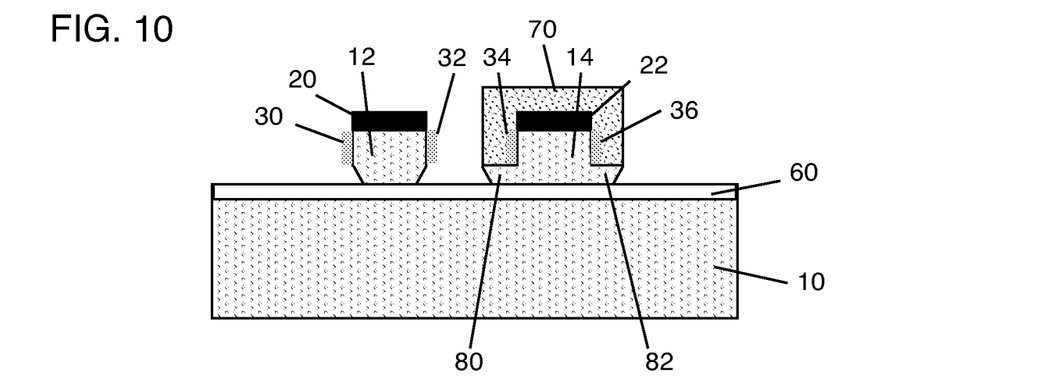
Figure 11:
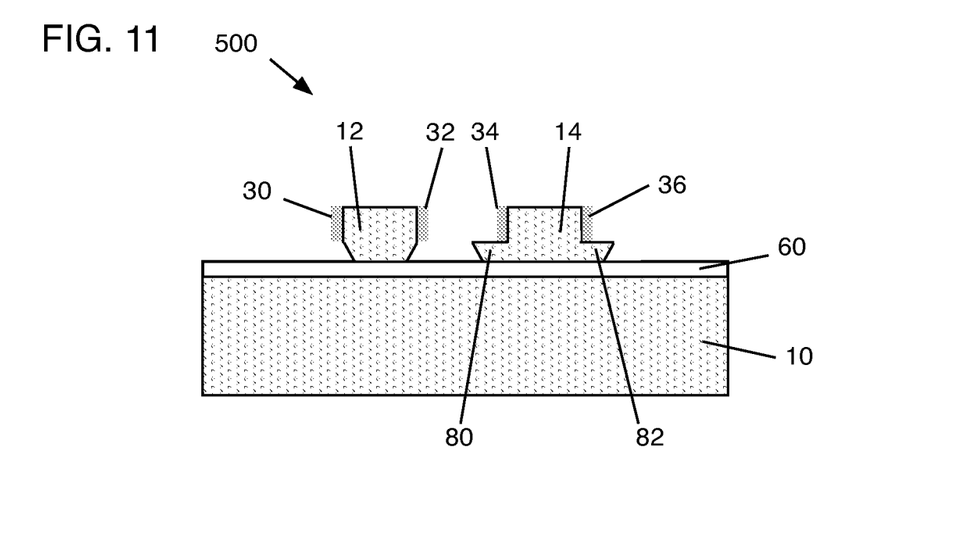

FIGS. 9-12 show yet another embodiment of the invention. In FIG. 9, prior to isotropically etching substrate 10, an additional photoresist layer 70 is applied atop patterning film 22, sidewall spacers 34 and 36, and adjoining portions 16, 18 of substrate 10. In FIG. 10, substrate 10 has been etched to the level of transparent etch stop layer 60, yielding positive sidewalls 80, 82. While substrate 10 is shown in this embodiment as including transparent etch stop layer 60, as noted above, this is not essential. FIG. 11 shows the finished photomask 500 with the patterned layer 20, 22 and additional photoresist 70 removed.

Figure 12:
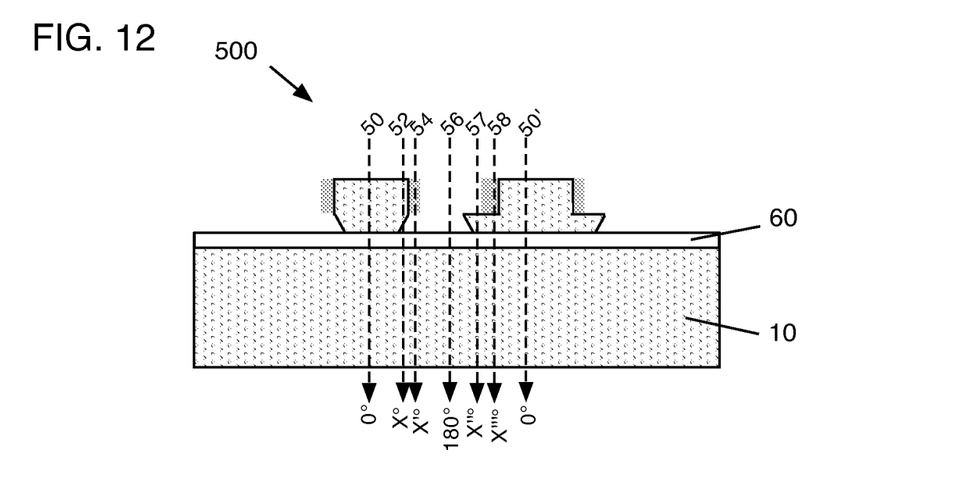
FIG. 12 shows transmission paths through the photomask of FIG. 11.

FIG. 12 shows light transmission paths through photomask 500. For the sake of clarity of description, most reference numbers of the photomask components have been removed in FIG. 12. The components are the same as, and will be described with respect to, those shown in FIG. 11. The photomask 500 shown in FIG. 12 includes six different light transmission paths 50, 52, 54, 56, 57, 58, each yielding a potentially distinct phase shift. The first path 50 (and similarly 50') passes through pedestal 12 (and similarly 14), transparent etch stop layer 60, and substrate 10, yielding a relative phase shift of 0°. The fourth path 56 passes through transparent etch stop layer 60 and substrate 10, yielding a relative phase shift of 180° with respect to first path 50.

The second path 52 passes through pedestal 12, the atmosphere within the undercut (40B in FIG. 4) of pedestal 12, transparent etch stop layer 60, and substrate 10, yielding a phase shift X between that of first path 50 and fourth path 56. The third path 54 passes through sidewall spacer 32, the atmosphere beneath sidewall spacer 32, transparent etch stop liner 60, and substrate 10, yielding a phase shift X' between that of second path 52 and fourth path 56.

The fifth path 57 passes through positive sidewall 80, transparent etch stop layer 60, and substrate 10, yielding a phase shift X" greater than that of fourth path 56. The sixth path 58 passes through sidewall spacer 34, positive sidewall 80, transparent etch stop layer 60, and substrate 10, yielding a phase shift X''' greater than that of fifth path 57.

As noted above with respect to other embodiments of the invention, removing one or more sidewall spacers 30, 32, 34, 36 would reduce the number of transmission paths. For example, still referring to FIGS. 11 and 12, removing sidewall spacer 32 would eliminate third path 54, which becomes the same as fourth path 56.

Figure 13:
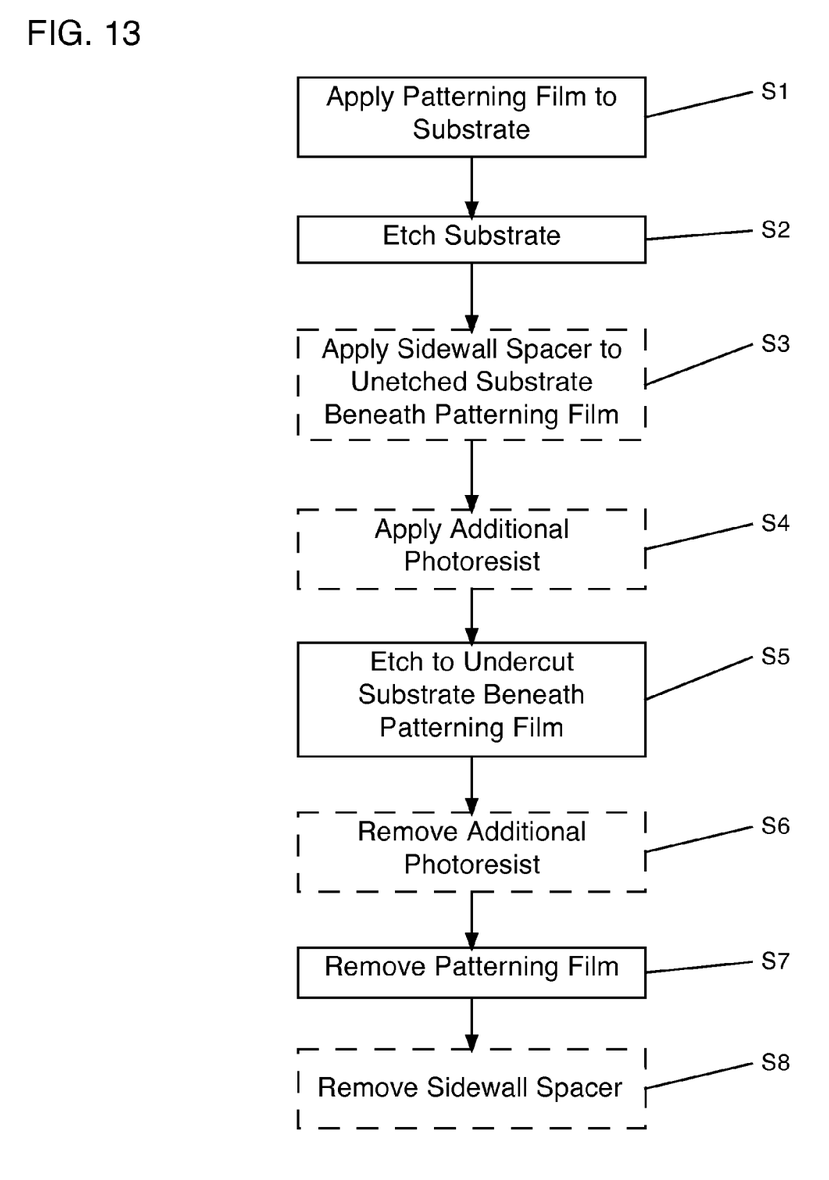
FIG. 13 shows a flow diagram of a method according to an embodiment of the invention.

FIG. 13 shows a flow diagram according to one embodiment of the invention. At S1, a patterning film (FIG. 1: 20, 22) is applied to a portion of a transparent substrate (FIG. 1: 10). At S2, the substrate (10) is etched to a depth (FIG. 2: D) to remove a portion of the substrate not beneath the patterning film (20, 22). At S3, a sidewall spacer (FIG. 3: 30, 32, 34, 36) may optionally be applied to an pedestal (FIG. 3: 12, 14) of the substrate (10) beneath the patterning film (20, 22). At S4, an additional photoresist (FIG. 9: 70) may optionally be applied over the patterning film (22) and, if applied at S3, the sidewall spacer (34, 36).

At S5, the substrate (10) is etched to undercut (FIG. 4: 40A, 40B, 40C, 40D) a portion of the substrate (10) beneath the patterning film (20, 22) applied at S1. If applied at S4, the additional photoresist (70) is removed at S6. The patterning film (20, 22) applied at S1 is removed at S7 and, if applied, the sidewall spacer (30, 32, 34, 36) is removed at S8.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of manufacturing a phase-shifting photomask having a self-aligned rim-shifting element, the method comprising:

applying a first patterning film and a second patterning film to a first portion of a transparent substrate;

etching the transparent substrate to a depth to remove a second portion of the transparent substrate not beneath the first and second patterning films to thereby define a third portion of the transparent substrate above the depth to which the transparent substrate is selectively etched, and a fourth portion of the transparent substrate above the depth to which the transparent substrate is selectively etched;

applying a conformal film to the transparent substrate;

using anisotropic etching to form a first sidewall spacer on the third portion of the transparent substrate, and a second sidewall spacer on the fourth portion of the transparent substrate;

applying an additional photoresist layer atop the second patterning film, the second sidewall spacer, and an area of the transparent substrate adjacent the second sidewall spacer;

etching the third portion of the transparent substrate and the first portion of the transparent substrate, beneath the first sidewall spacer to undercut an area beneath the first patterning film;

etching the first portion of the transparent substrate beneath the additional photoresist layer, to undercut the area of the transparent substrate adjacent the second sidewall spacer;

removing the additional photoresist layer to thereby yield a positive sidewall portion of the transparent substrate, above the first portion of the transparent substrate; and removing the first and second patterning films;

wherein the etched transparent substrate forms a self-aligned undercut rim-shifting element.

2. The method of claim 1, wherein the transparent substrate is selected from a group consisting of: quartz, fused silica, and crystalline fluorides.

3. The method of claim 1, wherein one of the first patterning film and the second patterning film is selected from a group consisting of: chromium, a refractory metal, a metal silicide, a metal nitride, silicon, amorphous silicon, carbon, and amorphous carbon.

4. The method of claim 1, wherein the etching of the transparent substrate to the depth of the second portion includes etching using at least one etching technique selected from a group consisting of: reactive ion etching and isotropic chemical etching.

5. The method of claim 1, wherein the self-aligned undercut rim-shifting element includes:

a first path through the first portion of the transparent substrate and the third portion of the transparent substrate above the depth to which the transparent substrate is selectively etched;

a second path through the first portion of the transparent substrate, an atmosphere within the undercut area of the third portion of the transparent substrate, and the third portion of the transparent substrate;

a third path through the first portion of the transparent substrate;

a fourth path through the first portion of the transparent substrate, an atmosphere beneath the first sidewall spacer, and the first sidewall spacer;

a fifth path through the first portion of the transparent substrate and the positive sidewall portion of the transparent substrate;

a sixth path through the first portion of the transparent substrate, the fourth portion of the transparent substrate, and the second sidewall spacer; and a seventh path through the first portion of the transparent substrate and the fourth portion of the transparent substrate.

6. The method of claim 1, wherein one of the first sidewall spacer and the second sidewall spacer is selected from a group consisting of: quartz, photoresist, and polyimide.

7. The method of claim 1, wherein the transparent substrate includes a transparent etch stop layer at the depth to which the transparent substrate is etched.

8. The method of claim 7, wherein the transparent etch stop layer is selected from a group consisting of: doped quartz, sapphire, and silicon.

* * * * *